(12) United States Patent
Zhao (10) Patent No.: US 6,852,565 B1
(45) Date of Patent: Feb. 8, 2005

(54) CMOS IMAGE SENSOR WITH SUBSTRATE NOISE BARRIER (75) Inventor: Lixin Zhao, Fremont, CA (US)

(73) Assignee: Galaxcore, Inc., Cayman Islands (KY)

( * ) Notice: Subject to any disclaimer, the term of this patent is extended or adjusted under 35 U.S.C. 154(b) by 0 days.

(21) Appl. No.: 10/619,033

(22) Filed: Jul. 10, 2003

(51) Int. Cl.[7] ............ H01L 21/00; H01L 21/8238
(52) U.S. Cl. ............ 438/73; 438/75; 438/76; 438/200
(58) Field of Search ............ 438/73, 75, 76, 438/200

(56) References Cited

U.S. PATENT DOCUMENTS 6,084,259 A * 7/2000 Kwon et al. ............ 257/292
6,472,698 B1 * 10/2002 Nakashiba ............ 257/222
6,586,789 B1 * 7/2003 Zhao ............ 257/292
2002/0100915 A1 * 8/2002 Hynecek ............ 257/158

FOREIGN PATENT DOCUMENTS

GB        2240429    * 7/1991   ....... H01L/31/0352

* cited by examiner

Primary Examiner—William M. Brewster
(74) Attorney, Agent, or Firm—Joe Zheng (57) ABSTRACT An image sensor element includes a vertical overflow drain structure to eliminate substrate charge diffusion causing CMOS image sensor noise. An extra chemical mechanical polish step used to shorten the micro-lens to silicon surface distance in order to reduce optical cross talking. One embodiment uses N type substrate material with P− epitaxial layer to form a vertical overflow drain. Deep P well implantation is introduced to the standard CMOS process to prevent latch-up between an N well to an N type substrate. A photo diode is realized by stacked N well/Deep N well and stacked P well/Deep P well to improve performance.

20 Claims, 6 Drawing Sheets

CMOS IMAGE SENSOR WITH SUBSTRATE NOISE BARRIER

FIELD OF THE TECHNOLOGY

Embodiments of the present invention relate to semiconductor devices, and more specifically to a solid-state image sensor.

BACKGROUND

Image sensors can be used in a variety of applications, such as digital still cameras, PC cameras, digital camcorders and Personal Communication Systems (PCS), as well as analog and digital TV and video systems, video game machines, security cameras and micro cameras for medical treatment. With the development of the telecommunication and computer system, the demand for image sensors will be much more increased.

An image sensor cell typically has a photodiode element that is capable of converting light (e.g., visible light, infrared light and ultraviolet light) into electric signals. When photons are absorbed, electron-hole pairs are created through photoelectric conversion. A depletion region is formed in a photodiode when the photodiode is reverse-biased. The electric field in the depletion region separates the electron-hole pairs, which generated from the photoelectric conversion.

The electric current generated from the photoelectric conversion can be directly measured to determine the intensity of the light. However, the signal generated from the direct measurement of the current from the photoelectric conversion typically has a poor signal to noise (S/N) ratio. Thus, a typical image sensor accumulates the charges generated from the photoelectric conversion for a predetermined period; and, the amount of accumulated charges is measured to determine the intensity of the light.

To measure the accumulated (photoelectric) charges, a CMOS (Complementary Metal-Oxide Semiconductor) Active Pixel Sensor (APS) contains active circuit elements (e.g., transistors) for measuring the signal associated with the accumulated photoelectric charges. Alternatively, the accumulated charges can be moved out of an image sensor cell for measurement (e.g., in a CMOS Passive Pixel Sensor (PPS) or in a Charge Coupled Device (CCD) image sensor). In order to prevent noise, a CCD image sensor uses a complicated process to transfer the accumulated charges from the sensor cell to an amplifier for measurement. A CCD device uses complicated driving signals of large voltage swings, and thus, consumes a lot of power. A typical CCD fabrication process is optimized for charge transfer; and it is not compatible with a standard CMOS process. Thus, a CCD image sensor is difficult to be integrated with signal processing circuitry, which is typically implemented by Complementary Metal-Oxide Semiconductor (CMOS) circuitry, and thus, difficult to be implemented in a wider variety of applications.

Figure 1:
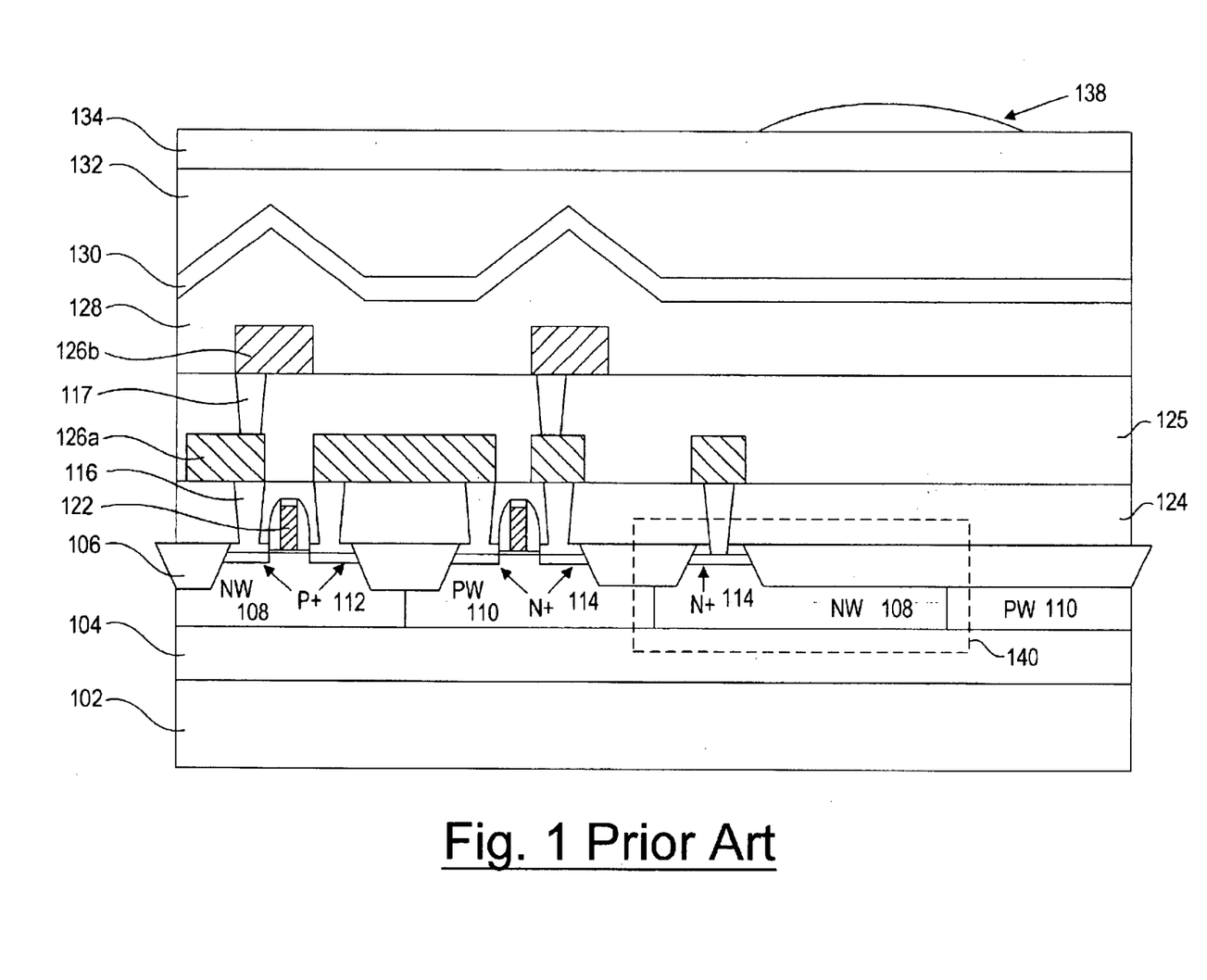
FIG. 1 is a conventional CMOS image sensor.

CMOS image sensors include two portions. The first portion is a sensor array that converts a photon signal to an electric signal; and the second part is accessory circuits that include analog circuits for signal read out and logic control circuits. A standard CMOS process is employed to fabricate such as CMOS image sensors. FIG. 1 is a cross-sectional view of a prior art CMOS image sensor which includes a P channel transistor. (shown left in the figure), an N channel transistor (shown center in the figure) and a Photo diode (shown right in the figure).

Referring now to FIG. 1, a conventional CMOS image sensor 100 starts with a P+ type semiconductor material substrate 102. A P− type semiconductor material EPI layer 104 is then layered on top of a P+ substrate 102. A P− EPI layer 104 has a resistance around 8Ω~12Ω and a boron doping density of approximately $2 \times 10^{15}$ atom/cm$^3$. Subsequently, the Shallow Trench 106 is formed. The Shallow Trench Isolation process, a common practice in current CMOS sensor manufacture, allows a much lower dark current than the traditional LOCOS process (local oxidation process).

After the STI 106 is formed, N wells 108 and P wells 110 are implanted separately. Then the poly gate 122 is formed. After the poly gate 122 is formed, N+ 114 and P+ 112 are implanted to form the CMOS transistor source and drain. The Photo diode 140 is formed by an N well 108/P sub 104 junction. For most popular three transistors active pixel cell, the N+ 114 implant contacts with the N well 108 in the photo diode 140 and outputs photo converted voltage which is the output signal of the photo diode 140.

After the transistor source and drain are formed, an oxide layer 124 is deposited, a process of chemical and mechanical polishing (CMP) is used and the contact 116 is formed. The backend process continues to form a Metal 1 Layer 126a, deposits an Oxide layer 125, a process of CMP is used, and Vial 117 is formed. The backend is repeated to form a desired number of metal layers.

Referring now again to FIG. 1, there also shows a double layer metal process. After a top layer metal 126b is formed, the High Density Plasma Enhanced CVD process deposits about 8000 Angstrom oxide layer 128 to the wafer top. The High Density Plasma Enhanced CVD process is followed by depositing about 5000 Angstrom Si3N4 CVD layer 130 for passivation. For a conventional CMOS image sensor, above passivation layer, a Spin-On-Glass (SOG) layer 132 is needed for planarization. Then a color filter layer 134 is added. Subsequently, a micro-lens 138 is formed. A Micro-lens can significantly increase the sensor pixel sensitivity because it focuses the light to photo diode sense area.

The conventional CMOS image sensor process has two disadvantages. The first disadvantage is that poor MTF (modulate transfer function) and high noise caused by charge diffusion in substrate field-free region. The photo diode is formed by N well to P-EPI junction (or N+ to P-EPI junction). The N well is set to high voltage around 2V. The P-EPI and P+ substrate are linked to the ground. The N well/P sub photo diode depletion layer is around 1~3 um deep. Below the depletion area is the P-EPI and P+ substrate layer which is at some potential level and is an electric field free region. It's well known that in silicon, long wave-length light can penetrate much deeper than above mentioned photo diode depletion region.

For example, a red light (wave length ~7000 Angstrom) silicon absorption depth is 4.7 um. A lot of photo generated electron and hole pairs are in the P−EPI/P+Sub field free region instead of the photo diode depletion region. If the photo generated electron/hole is in the photo diode depletion region, the electrons will be kept in the N well node. The holes will be repealed to the substrate. The electrons accumulated in the N well node will respond to the input light density. However, if the photo generated electron/hole is in the P-EPI/P+sub field free region. The electrons/hole pairs will move in the substrate by temperature vibration. Some of the electrons/hole pairs will be recombined in the substrate However, there are still a significant amount of electrons that will be diffused to the neighbor photo diodes and cause poor MTF and high noise. The diffusion length, which is approximately a few millimeters, is much longer than a typical pixel cell size, which is approximately a few micrometers.

The second disadvantage is the large distance between the micro-lens 138 to the photo-sensitive silicon region (N well 108/P-EPI 104). Because modern CMOS process has quite many metal layers (e.g., 126a and 126b), together with an image sensor planariztion layer 132 and a color filter layer 134. This large distance will lower the sensor sensitivity and cause the optical cross talk problems between sensor pixels.

Therefore, there is a need for a CMOS image sensor that produces high MTF, low noise and short distance from micro-lens to silicon surface.

SUMMARY OF INVENTION

The present invention pertains to new designs of CMOS Image sensors. According to one aspect of the present invention, the substrate traditionally used in the CMOS process is a same doping type of an EPI layer and replaced by a substrate that is of different doping type of the EPI layer, leading to layers on top of each other. When two different voltages are applied respectively to the two layers, a reversely biased junction is formed between the two layers so as to form a potential barrier under a photo diode. The potential barrier prevents noise electrons diffusing from a substrate layer (e.g., the lower one of the two layers) to the photo diode. According to another aspect of the present invention, a deep well with the same type of the EPI layer is implanted in the EPI layer to prevent latch-up between wells and the substrate. According to still another aspect of the present invention, the distance between a micro lens and a corresponding photodiode is reduced by adding an extra CMP step after a last oxide layer deposition.

One of the objects in the present invention is to provide improved designs on CMOS image sensors with low substrate diffusing noise and reduced distance between microlenses and photo diodes.

Objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will become better understood with regard to the following description, appended claims, and accompanying drawings where:

DETAILED DESCRIPTION OF EMBODIMENTS

Embodiments of the invention are discussed herein with reference to FIGS. 2–6. However, those skilled in the art will readily appreciate that the detailed description given herein with respect to these figures is for explanatory purposes as the invention extends beyond these limited embodiments.

Figure 2:
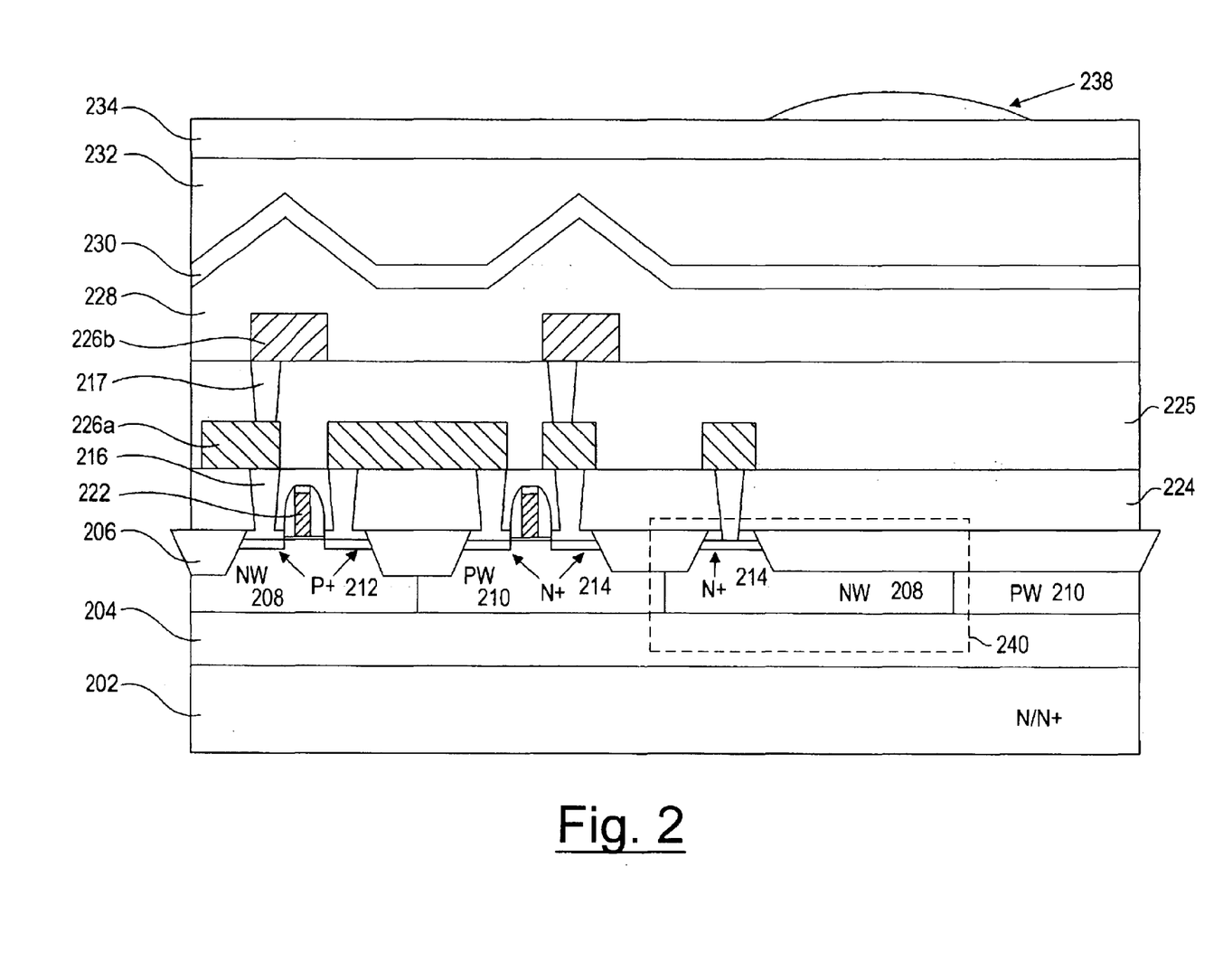
FIG. 2 is a cross-section view of a CMOS image sensor according to one embodiment of the present invention.

Referring now to FIG. 2, a CMOS image sensor according to one embodiment of the present invention is shown. Unlike the conventional CMOS image sensor, a CMOS image sensor according to one embodiment of the present invention includes an N or N+ type substrate layer 202, in contrast to a conventional P+ substrate.

A P– type Epi layer on top of an N/N+ type substrate 202 is connected to the ground and N/N+ type substrate 202 is connected to certain high voltage e.g., 2V. A depletion layer is formed between the interface P–Epi layer 204 to the N/N+ substrate 202. This depletion layer minimizes the P–EPI field-free region which is just under the photo diode depletion part also prevents photo generated charges in the substrate to be diffused back to the photo diode depletion area.

Subsequently, the Shallow Trench 206 is formed, The Shallow Trench Isolation process, a common practice in the current CMOS sensor manufacture, allows a much lower dark current than the traditional LOCOS process (local oxidation process).

After the STI 206 is formed, an N well 208 and a P well 210 are implanted separately. Then a poly gate 222 is formed. After the poly gate 222 is formed, N+ 114 and P+ 212 are implanted to form the CMOS transistor source and drain. The Photo diode 240 is formed by the N well 208/P sub 240 junction. For most popular three transistors active pixel cell, the N+ 214 implant contacts with the N well 208 in the photo diode and output photo convert voltage, which is the output signal.

After the transistor source and drain are formed, an oxide layer 224 is deposited, a process of chemical and mechanical polishing (CMP) is used and the contact 216 is formed. The backend process continues to form a Metal 1 Layer 226a, deposits Oxide 225, a process of CMP is used and Vial 217 is formed. The backend is repeated to form a desired number of metal layers.

FIG. 2 also demonstrates a double metal process. After a top layer metal 226b is formed, the High Density Plasma Enhanced CVD process deposits about 8000 Angstrom oxide layer 228 to the wafer top. The High Density Plasma Enhanced CVD process is followed by depositing about 5000 Angstrom Si3N4 CVD layer 230 for passivation. Above passivation layer, a Spin On Glass (SOG) layer 232 is needed for planarization. Then a color filter layer 234 is added. Subsequently, a micro-lens 238 is formed. A micro-lens can significantly increase the sensor pixel sensitivity because it focuses the light to the photo diode sense area.

Figure 3:
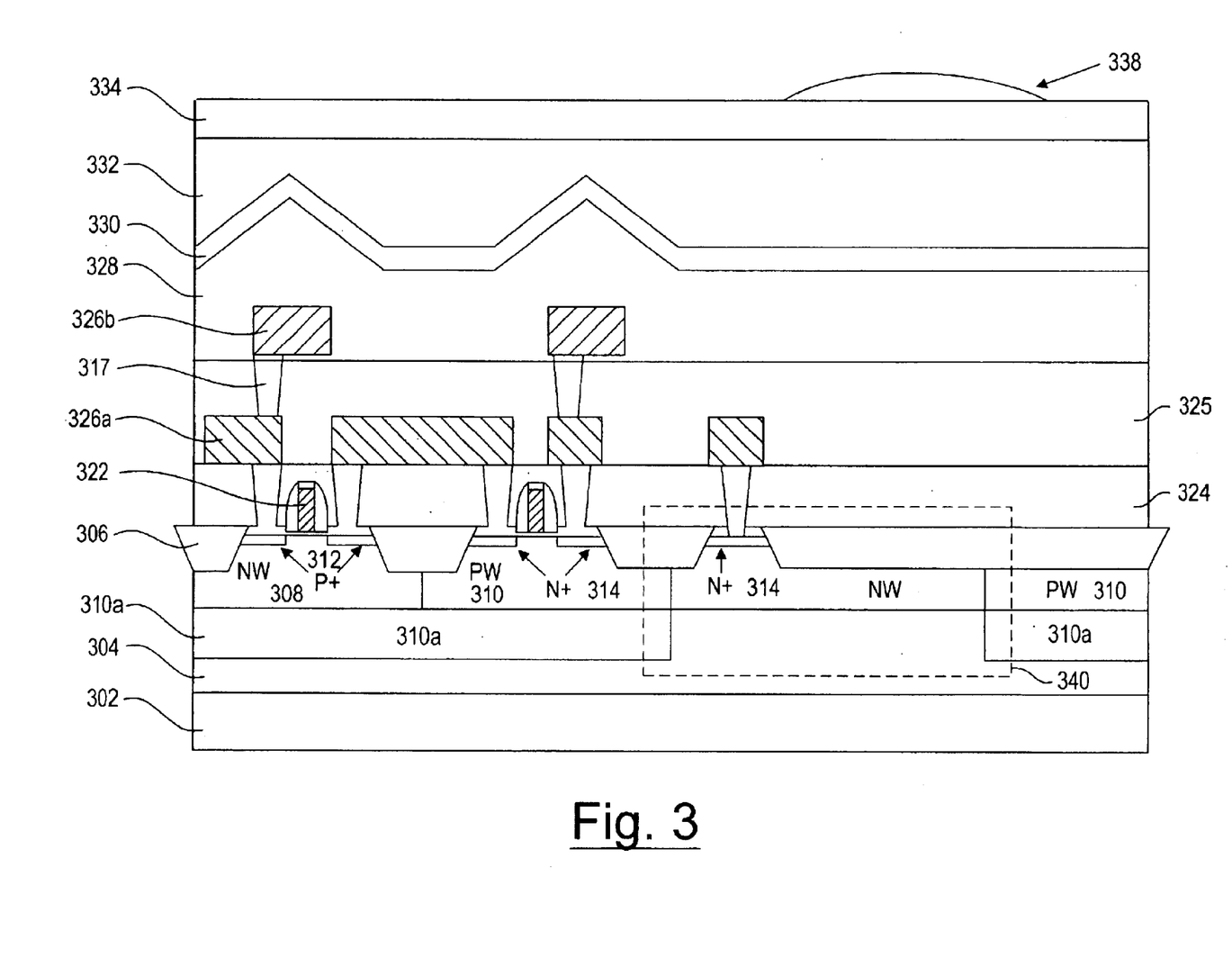
FIG. 3 is a cross-section view of of a CMOS image sensor according to one embodiment of the present invention.

Referring now to FIG. 3, a CMOS image sensor according to one embodiment of the present invention is shown. Unlike a conventional CMOS image sensor, deep P type well is implanted below the standard N and P type wells.

A CMOS image sensor 300 according to present invention starts with an N type semiconductor material substrate 302 substrate has a concentration of phosporous of approximately $1 \times 10^{17}$ atom/cm$^3$. A P– type semiconductor material EPI layer 304 is formed on top of the N substrate 302. The P–EPI layer 304 has a resistance around 8Ω~12Ω and a boron doping density of approximate $2 \times 10^{15}$ atom/cm$^3$. The P– type Epi layer 304 has a thickness of about 3 to 10 micrometer (um). The N type substrate 302 is connected to a high voltage, e.g., 2V. The P– type Epi layer 304 is connected to the ground.

Subsequently, a deep P type well 310a is formed. The deep P type well 310a has a center depth ranging from 1.5 micrometer (um) to 3 um and thickness around 1 um to 3 um. After the deep P well 310a is formed. The STI 306 is formed, then standard N well 308 and standard P well 310 are implanted separately.

In the sensor cell array area 340, the standard N well 308 is formed on top of P-EPI 304 to form a photo sense N well region, the standard P well 310 lies on top of the deep P well 310a and connect to the ground.

Outside the sensor cell array area 340, a standard N well 308 and a standard P well 310 all lie on top of a deep P well 310a. The P-EPI layer 304, standard P well 310 and deep P well 310a are connected to the ground. In this way, the deep P well 310a can prevent possible latch-up between N well 308 to N type substrate 302 in the sensor outside circuits area.

Next, the poly gate 322 is formed. After the poly gate 322 is formed, N+ 314 and P+ 312 are implanted to form the CMOS transistor source and drain. For most popular three transistors active pixel cell, the N+ 314 implant contacts with the N well 308 in photo diode and output photo convert voltage, which is the output signal.

After the transistor source and drain are formed, an oxide layer 324 is deposited, a process of chemical and mechanical polishing (CMP) is used and the contact 316 is formed. The backend process continues to form a Metal 1 Layer 326a, deposits Oxide layer 325, a process of CMP is used and Vial 317 is formed. The backend is repeated to form a desired number of metal layers.

FIG. 3 demonstrates a double metal process. After the top layer metal 326b is formed, the High Density Plasma Enhanced CVD process deposits about 8000 Angstrom oxide layer 328 to the wafer top. The High Density Plasma Enhanced CVD process is followed by depositing about 5000 Angstrom Si3N4 CVD layer 330 for passivation. For a CMOS image sensor according to one embodiment of the present invention, above passivation layer, a Spin On Glass (SOG) layer 332 is needed for planarization. Then a color filter layer 334 is added. Subsequently, a micro-lens 338 is formed. A Micro-lens can significantly increase the sensor pixel sensitivity because it focuses the light to photo diode sense area.

Figure 4:
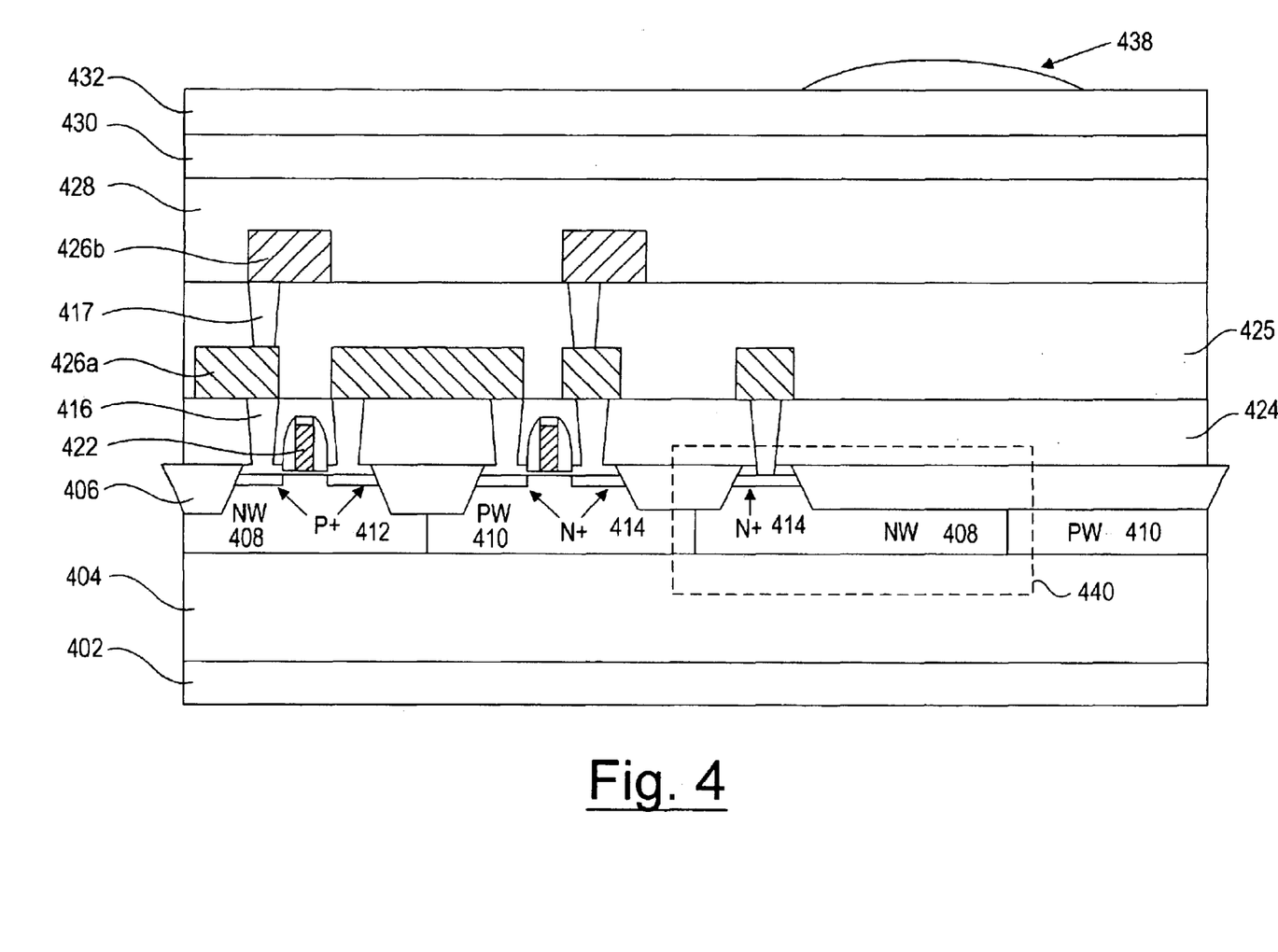
FIG. 4 is a cross-section view of of a CMOS image sensor according to one embodiment of the present invention.

Referring now to FIG. 4, a CMOS image sensor according to one embodiment of the present invention is illustrated. Unlike a conventional CMOS image sensor 100, after deposited the last oxidation layer on the top metal, an extra oxide CMP step is carried out to smooth over the oxide layer. Due to an extra oxide CMP step, the conventional SOG layer is not needed in the embodiment of the present invention.

A CMOS image sensor 400 starts with a P+ type semiconductor material substrate 402. In other embodiments, a semiconductor material substrate 402 can be an N type. A P-type semiconductor material EPI layer 404 is then layered on top of a P+ substrate 402. A P-EPI layer 404 has a resistivity around 8Ω~12Ω and a boron doping density of approximate $2 \times 10^{15}$.

Subsequently, the Shallow Trench 406 is formed. N well 408 and P well 410 are implanted separately. Then a poly gate 422 is formed. After poly gate 422 is formed, N+ 414 and P+ 412 are implanted to form the CMOS transistor source and drain. The Photo diode 440 is formed by N well 408/P sub 404 junction. For most popular three transistors active pixel cell, the N+ 414 implant contacts with the N well 408 in photo diode and output photo convert voltage, which is the output signal.

After the transistor source and drain are formed, an oxide layer 424 is deposited, a process of chemical and mechanical polishing (CMP) is used and the contact 416 is formed. The backend process continues to form a Metal 1 Layer 426a, deposits Oxide layer 425, a process of CMP is used and Vial 417 is formed. The backend is repeated to form desired number of metal layers.

After a top layer metal 426b is formed, the High Density Plasma Enhanced CVD process deposits about 8000 Angstrom oxide layer 428 to the wafer top. Unlike a conventional CMOS image sensor, an extra step of top oxide layer CMP process is adopted here.

To coordinate with the top oxide layer CMP, after deposited 8000 Angstrom oxide layer 428 on the wafer top, about 10K Angstrom TEOS will be deposited and then followed by the Oxide CMP. After this top oxide CMP process, about 4000 Angstrom Si3N4 CVD layer 430 is deposited for passivation. Since the extra CMP is adopted here, the Spin On Glass (SOG) layer is eliminated for planarization. The color filter layer 434 is directly put on Si3N4 layer top and followed by micro-lens 438 forming. With the extra top oxide CMP step. The distance from micro-lens to silicon surface is reduced.

Figure 5:
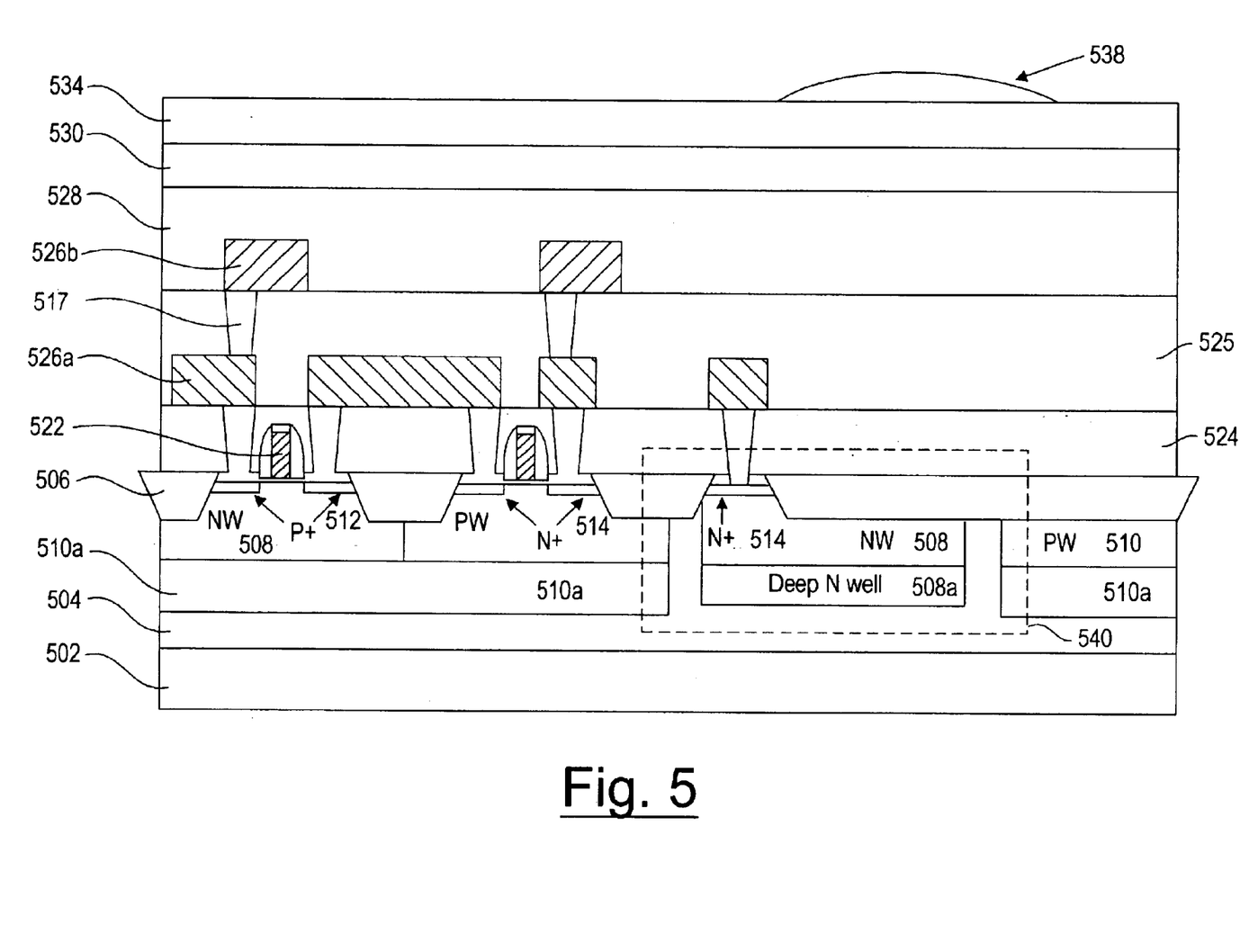
FIG. 5 is a cross-section view of of a CMOS image sensor according to one embodiment of the present invention.

Referring now to FIG. 5, a CMOS image sensor according to one embodiment of the present invention is illustrated. Unlike a conventional CMOS image sensor, a CMOS image sensor according to one embodiment of the present invention 500 includes an N type substrate 502 and a deep P well region 510a and a deep N well region 508a. In addition, a CMOS image sensor according to one embodiment of the present invention 500 does not include a layer of spin on glass (SOG).

A CMOS image sensor according to one embodiment of the present invention includes an N substrate layer 502, in contrast to a conventional P+ substrate 102 in FIG. 1. A P-type Epi layer 504 on top of N type substrate 502 is connecting to ground and N type substrate 502 is connected to certain high voltage e.g., 2V. A depletion layer is formed between the interface of P-Epi layer 504 to N substrate 502. This depletion layer minimizes the P-EPI field-free region which is just under the photo diode depletion part. And also prevent substrate photo generate charge diffusion back to photo diode depletion area.

Subsequently, a deep P type well 510a is formed. The deep P type well 510a has a center depth ranging from 1.5 micrometer (um) to 3 um and thickness around 1 um to 3 um. Next a deep N type well 508a is formed. The deep N type well 508a has a center depth ranging from 1.5 micrometer (um) to 2.5 um and thickness around 1 um to 3 um.

After the deep P well 510a and the deep N well 508a are formed. The STI 506 is formed, then a standard N well 508 and a standard P well 510 are implanted separately.

In the sensor cell array area 540, the standard N well 508 is formed on top of deep N well 508a to form photo sense N well region, the standard P well 510 lies on top of deep P well 510a and connect to ground. There is a certain space between N well region 508/508a to P well region 510/510a to reduce the electric field strength in order to reduce the dark current.

Outside the sensor cell array area 540, the standard N well 508 and standard P well 510 all lie on top of a deep P well 510a. The P-EPI layer 504, standard P well 510 and deep P well 510a are connected to the ground. In this way, the deep P well 510a can prevent possible latch-up between N well 508 to N type substrate 502 in sensor outside circuits area.

Next, the poly gate 522 is formed. After the poly gate 522 is formed, N+ 514 and P+ 512 are implanted to form the CMOS transistor source and drain. For most popular three transistors active pixel cell, the N+ 514 implant contacts with the N well 508/508a in the photo diode and output a photo convert voltage, which is the output signal.

After the transistor source and drain are formed, an oxide layer 524 is deposited, a process of chemical and mechanical polishing (CMP) is used and the contact 516 is formed. The backend process continues to form a Metal 1 Layer 526a, deposits Oxide layer 525, a process of CMP is used and Vial 517 is formed. The backend is repeated to form a desired number of metal layers.

Next, a top layer metal 526b is formed, the High Density Plasma Enhanced CVD process deposits about 8000 Angstrom oxide layer 528 to the wafer top. Unlike a conventional CMOS image sensor, an extra step of top oxide layer CMP process is adopted here.

To coordinate with the top oxide layer CMP, after deposited 8000 Angstrom oxide layer 528 on the wafer top, about 10K Angstrom TEOS will be deposited, then followed by the Oxide CMP. After this top oxide CMP process, about 4000 Angstrom Si3N4 CVD layer 530 is formed for passivation. Since the extra CMP is adopted here, the Spin On Glass (SOG) layer is eliminated for planarization. The color filter layer 534 is directly put on Si3N4 layer top and followed by micro-lens 538 forming. With the extra top oxide CMP step. The distance from micro-lens to silicon surface is reduced.

Figure 6:
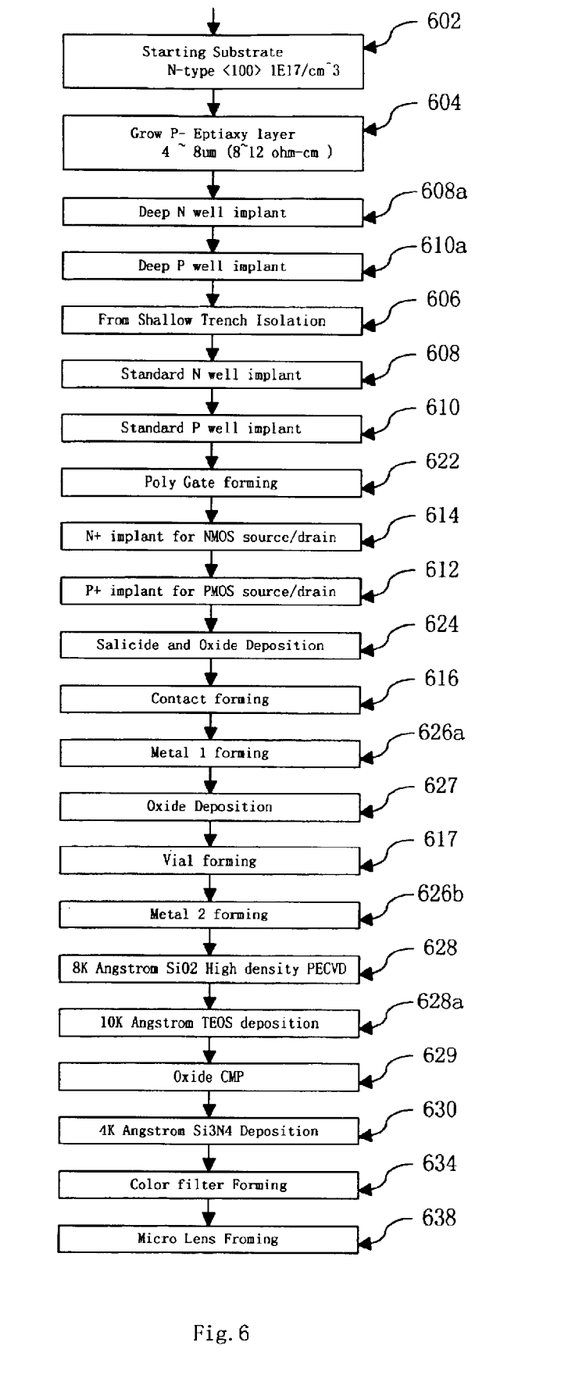
FIG. 6 is a flow chart of a CMOS image sensor fabrication process according to one embodiment of the present invention.

Referring now to FIG. 6, there shows a flow diagram of a CMOS image sensor fabrication process according to one embodiment of present invention. A CMOS image sensor fabrication process according to present invention includes the following steps: Step 602: Starting substrate N type, about 1E17 atom/cm$^3$ silicon wafer; Step 604: Growing a P-type epitaxy layer for a thickness of 4~10 um at 2E15 atom/cm$^3$ doping density (8~12 ohm-cm); Step 608a: Deep N well implantation has a center depth ranging from 1.5 micrometer (um) to 2.5 um and thickness around 1 um to 3 um; Step 610a: Deep P well implantation has a center depth ranging from 1.5 micrometer (um) to 3 um and thickness around 1 um to 3 um; Step 606: Shallow Trench Isolation forming; Step 608: Standard N well implantation; Step 610: Standard P well implantation; Step 622: Form poly silicon gate; Step 624: Salicide and Oxide deposition; Step 616: Contact Etch and W plug and W CMP to form contact; Step 626a: Metal 1 forming; Step 617: Oxide Deposition; Via 1 Etch and W plug and W CMP to form Via 1; Step 626b: Metal 2 forming; Step 628: Using High Density Plasma Enhanced CVD deposit ~8000 Angstrom Oxide on wafer surface; Step 628a: Deposit ~10000 Angstrom TEOS on wafer surface; Step 629: Applied Oxide CMP for the top oxide layer; Step 630: Deposit ~4000 Angstrom Si3N4 on wafer surface; Step 634: Color filter coating; Step 638: Micro Lens forming.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claim. Accordingly, the scope of the present invention is defined by the appended claims rather than the forgoing description of embodiments.

What is claimed is:

1. A method of forming a CMOS image sensor, the method comprising:

forming a substrate with a first layer being a first conductive type of a semiconductor material and a second layer being a second conductive type, the second layer being on top of the first layer and fully covering the first layer so as to form a junction therebetween that prevents substrate noise diffused into photo elements when a first voltage is applied to the first layer and a second voltage is applied to the second layer, wherein the junction is reversely biased, and wherein the CMOS image sensor is integrated with accessory CMOS circuits to facilitate the CMOS Image sensor to operate as desired.

2. The method as in claim 1, wherein the junction is so formed to be a substrate noise barrier in the CMOS image sensor.

3. The method as in claim 1, further comprising:

forming a deep well of the second conductive type in the second layer to prevent latch-up between the accessory CMOS circuits and the first layer.

4. The method as in claim 1, further comprising:

forming a photodiode element, the photodiode element having a first well region of the first conductive type formed in the second layer of the second conductive type; and causing a second well region of the second conductive type to be formed in the second layer of the second conductive type with higher doping density than that of the second layer of the second conductive type.

5. The method as in claim 4, wherein the second well surrounds the first well region to form a lateral PN Junction.

6. The method as in claim 5, wherein the first well region and the second layer of the second conductive type forms a vertical PN Junction.

7. The method as in claim 6, wherein both the lateral PN junction and vertical junction are reversely biased.

8. The method as in claim 1, wherein a distance between a micro-lens and a photo element in the CMOS image sensor is reduced by adding an extra process of chemical mechanical polishing (CMP) to eliminate a conventional planarization layer such that sensitivity of the photo element is increased.

9. The method as in claim 1, further comprising:

forming a deep well of the second conductive type in the second layer to prevent latch-up between the accessory CMOS circuits and the first layer, and wherein the deep well is formed at a center depth in a range of 0.5 um to 2 um for a thickness in a range of 0.5 um to 2 um with the second conductive type doping outside the photo element to prevent the latch-up to happen.

10. The method as in claim 1, further comprising:

growing a top oxide layer on top of the second layer; and carrying out a process of chemical mechanical polishing (CMP).

11. The method as in claim 1, wherein the first layer is of N type, and the second layer is of P type, and wherein the first voltage is higher than the second voltage.

12. The method as in claim 1, wherein the first layer is of P type, and the second layer is of N type; and wherein the first voltage is lower than the second voltage.

13. A CMOS image sensor comprising:

a substrate including a first layer being a first type of a semiconductor material end a second layer being a second type of a semiconductor material disposed on top of first layer and fully covering the first layer to form a junction that prevents substrate noise diffused to photo elements when a first voltage is applied to the first layer and a second voltage is applied to the second layer, wherein the junction is reversely biased, and wherein the CMOS image sensor is integrated with accessory CMOS circuits to facilitate the CMOS Image sensor to operate.

14. The CMOS image sensor of claim 13, wherein the junction is so formed to be a substrate noise barrier that prevents substrate noise diffused into other photo elements in the CMOS image sensor.

15. The CMOS image sensor of claim 14, wherein a deep well of the second conductive type is formed in the second layer to prevent latch-up between the accessory CMOS circuits and the first layer.

16. The CMOS image sensor of claim 13 the first layer is of N type, and the second layer is of P type, and wherein the first voltage is higher than the second voltage.

17. The CMOS image sensor of claim 16, wherein a deep well of P type is formed in the second layer to prevent latch-up between wells to form a photo element and the first layer.

18. The CMOS image sensor of claim 13, wherein the first layer is of P type, and the second layer is of N type, and wherein the first voltage is lower than the second voltage.

19. The CMOS image sensor of claim 18, wherein a deep well of N type is formed in the second layer to prevent latch-up between wells to form a photo element and the first layer.

20. The CMOS image sensor of claim 13, wherein a distance between a micro-lens and one of the photo diodes is reduced by adding an extra process of chemical mechanical polishing (CMP) to eliminate a conventional planarization layer such as a sensitivity of the one of the photo diodes is increased.

* * * * *